United States Patent [19]

Gambino et al.

[11] Patent Number: 5,422,621

[45] Date of Patent: Jun. 6, 1995

[54] ORIENTED GRANULAR GIANT MAGNETORESISTANCE SENSOR

[75] Inventors: Richard J. Gambino, Stony Brook; James M. E. Harper; Thomas R. McGuire, both of Yorktown Heights; Thomas S. Plaskett, Katonah, all of N.Y.

[73] Assignee: International Business Machines Corporation, Armonk, N.Y.

[21] Appl. No.: 145,379

[22] Filed: Oct. 29, 1993

[51] Int. Cl.[6] ............................................. H01L 43/00
[52] U.S. Cl. .................................. 338/32 R; 324/252; 360/113
[58] Field of Search ................... 338/32 R; 360/113; 324/252

[56] References Cited

U.S. PATENT DOCUMENTS

| Re. 34,099 | 10/1992 | Krounbi et al. | 360/113 |
|---|---|---|---|
| 4,607,271 | 8/1986 | Popovic et al. | 357/27 |
| 4,712,144 | 12/1987 | Klaassen | 360/67 |
| 4,809,109 | 2/1989 | Howard et al. | 360/113 |
| 4,875,011 | 10/1989 | Namiki et al. | 324/251 |
| 5,132,859 | 7/1992 | Andricacos et al. | 360/113 |
| 5,155,642 | 10/1992 | Voegeli | 360/113 |
| 5,159,513 | 10/1992 | Dieny et al. | 360/113 |
| 5,193,039 | 3/1993 | Smith et al. | 360/113 |
| 5,196,821 | 3/1993 | Partin et al. | 338/32 R |
| 5,206,590 | 4/1993 | Dieny et al. | 324/252 |

FOREIGN PATENT DOCUMENTS

504473  9/1992  European Pat. Off. .
60-50612  3/1985  Japan .

OTHER PUBLICATIONS

Xiao, et al., 'Giant Magnetoresistance in Nonmultilayer Magnetic Systems'; Physical Review Letters; pp. 3749–3752, vol. 68, No. 25, Jun. 22, 1992.

C-A Chang, "Magnetization of (100) Cu-Ni, (100) Cu-Co, and (100) Ni-Co supperlattices deposited on silicon using a Cu seed layer", Appl. Phys. Lett. 57, 297 (1990).

R. L. White, "Giant magnetoresistance: A primer", IEEE Trans. on magnetics 28, 2482, 1992.

J. M. Daughton et al., "Giant magnetoresistance in narrow stripes", IEEE Trans. on Magnetics, 28, 2488, (1992).

S. Parkin et al. "Oscillatiors in exchange coupling and magnetoresistance in metallic superlattice structures: Co/Ru, CoCr and Fe/Cr", Phys. Rev. Lett. 64, 2304 (1990).

C-A Chang, "Outdiffusion of Cu through Au: Comparison of (100) and (111) Cu films epitaxially deposited on Si, and effects of annealing ambients", App. Phys. Lett. 55, 2754 (1989).

*Primary Examiner*—Marvin M. Lateef
*Attorney, Agent, or Firm*—Robert M. Trepp

[57] ABSTRACT

A giant magnetoresistance sensor incorporating an orientated granular layer wherein the layer has a copper matrix with magnetic particles of a nickel cobalt alloy wherein the magnetic particles have a magnetocrystalline anisotropy constant $K_1$ in the range from 0 to $3 \times 10^4$ ergs/cm$^3$. Alternatively, a silver or gold matrix may be used with magnetic particles of a nickel-ion alloy. The granular layer preferably has a (100) texture to provide the magnetic particles with their easy axes in the plane of the layer. The magnetic particles have their largest dimension in the range from 40 to 400 angstroms. The invention overcomes the problem of requiring a large magnetic field to obtain the saturation $\Delta R/R$. By providing a granular film with magnetic particles of low anisotropy, the saturation field to obtain $\Delta R/R$ may be as low as 10 to 20 Oe.

28 Claims, 3 Drawing Sheets

ORIENTED GRANULAR GIANT MAGNETORESISTANCE SENSOR

FIELD OF THE INVENTION

This invention relates generally to giant magnetoresistance sensors and more particular to magnetic particles in an oriented non-magnetic matrix.

BACKGROUND OF THE INVENTION

In order to take advantage of the giant magnetoresistance (GMR) effect in the read head of a magnetic storage system, the device must respond to magnetic fields of the order of 100 Oe. The giant magnetoresistance effect has been observed in multilayers such as for example, in a publication by S. Parkin et al, *Phys. Rev. Lett.* 64, 2304 (1990). The giant magnetoresistance effect has been observed in phase separated, granular Cu—Co films such as in a publication by J. Q. Xiao et al, *Phys. Rev. Lett.* 68, 3749 (1992). In both cases high magnetic fields are required for magnetic saturation. In the granular films, a polycrystalline metastable Cu—Co alloy film is deposited. With appropriate heat treatment Co precipitates as single domain particles, The magnetization is oriented along the easy axes of each particle which varies randomly from particle to particle. In a zero applied magnetic field, the resistance is high because the electron or hole carriers scatter at each interface where the magnetic orientation changes. At magnetic saturation, the resistance is low to electron or hole carriers because the magnetization of all of the particles is aligned. The magnetic field must overcome the magnetocrystalline anisotropy and the shape anisotropy of the Co particles. In addition, if there is any interfacial strain at the Cu/Co interface, there may be an additional anisotropy through the magnetostriction ($\lambda$).

SUMMARY OF THE INVENTION

In accordance with the present invention, a magnetoresistive sensor for sensing magnetic fields is described comprising an electrically conductive matrix in which magnetic particles are dispersed, the magnetic particles are of a single domain size having a diameter or length in the range from 40 to 400 angstroms, the magnetic particles have a respective magnetocrystalline anisotropy constant $K_1$ in the range from 0 to $3 \times 10^4$ ergs/cm$^3$ and a magnetostriction constant $\lambda$ less than 30 ppm. Further, the magnetic particles may be crystallographically oriented so that respective easy magnetic axes of the magnetic particles are substantially parallel to one another, for example in the plane of the conductive matrix and the magnetic field to be sensed.

The invention further provides a giant magnetoresistance sensor for sensing magnetic fields comprising a substrate, a first layer formed on the substrate, the first layer including particles of a single crystalline domain in a copper matrix, the particles including an alloy of Ni and Co where the amount of Co is in the range from 4 to 20 atomic percent, and first and second contacts spaced apart in ohmic contact with the first layer for passing electrical current therethrough. Alternatively, an Ag or Au matrix may be used with magnetic particles of a Ni—Fe alloy.

The invention further provides a method for forming a giant magnetoresistance sensor comprising the steps of forming a layer of Cu, Ni and Co with a (100) texture and precipitating magnetic particles of Ni—Co within the layer, the magnetic particles comprise Co in the range from 4 to 20 atomic percent. A single crystalline substrate having an upper surface in the (100) orientation or a seed layer having a (100) texture may be selected or formed prior to forming the layer of Cu, Ni and Co. Alternatively, a layer of Ag, Ni and Fe or Au, Ni and Fe maybe formed with a (100) texture and magnetic particles of Ni—Fe within the layer may be precipitated.

It is an object of the invention to provide a metal matrix with magnetic particles therein with low magneto crystalline anisotropy.

It is a further object of the invention to provide a metal matrix with magnetic particles therein with low magnetostriction so that the strain induced anisotropy will be small.

It is a further object of the invention to provide a metal matrix with magnetic particles therein with a preferred crystallographic orientation so that the easy magnetic axes of respective particles and the magnetic field to be sensed are in the same plane and typically the plane of the metal matrix.

It is a further object of the invention to provide a metal matrix with magnetic particles wherein the magnetic particles have a magnetocrystalline anisotropy constant ($K_1$) in the range from 0 to $3 \times 10^4$ ergs/cm$^3$ whereby $K_1$ is positive and the magnetic easy axes is along the (100) (010) and (001) directions.

It is a further object of the invention to provide a metal matrix with magnetic particles formed directly on a single crystal (100) silicon substrate, or a single crystal (100) silicon germanium substrate or on a (100) copper seed layer on a substrate.

It is a further object of the invention to provide an epitaxial granular film having a (100) texture.

BRIEF DESCRIPTION OF THE DRAWING

These and other features, objects, and advantages of the present invention will become apparent upon a consideration of the following detailed description of the invention when read in connection with the drawing, in which.

DESCRIPTION OF THE PREFERRED EMBODIMENT

Figure 1:
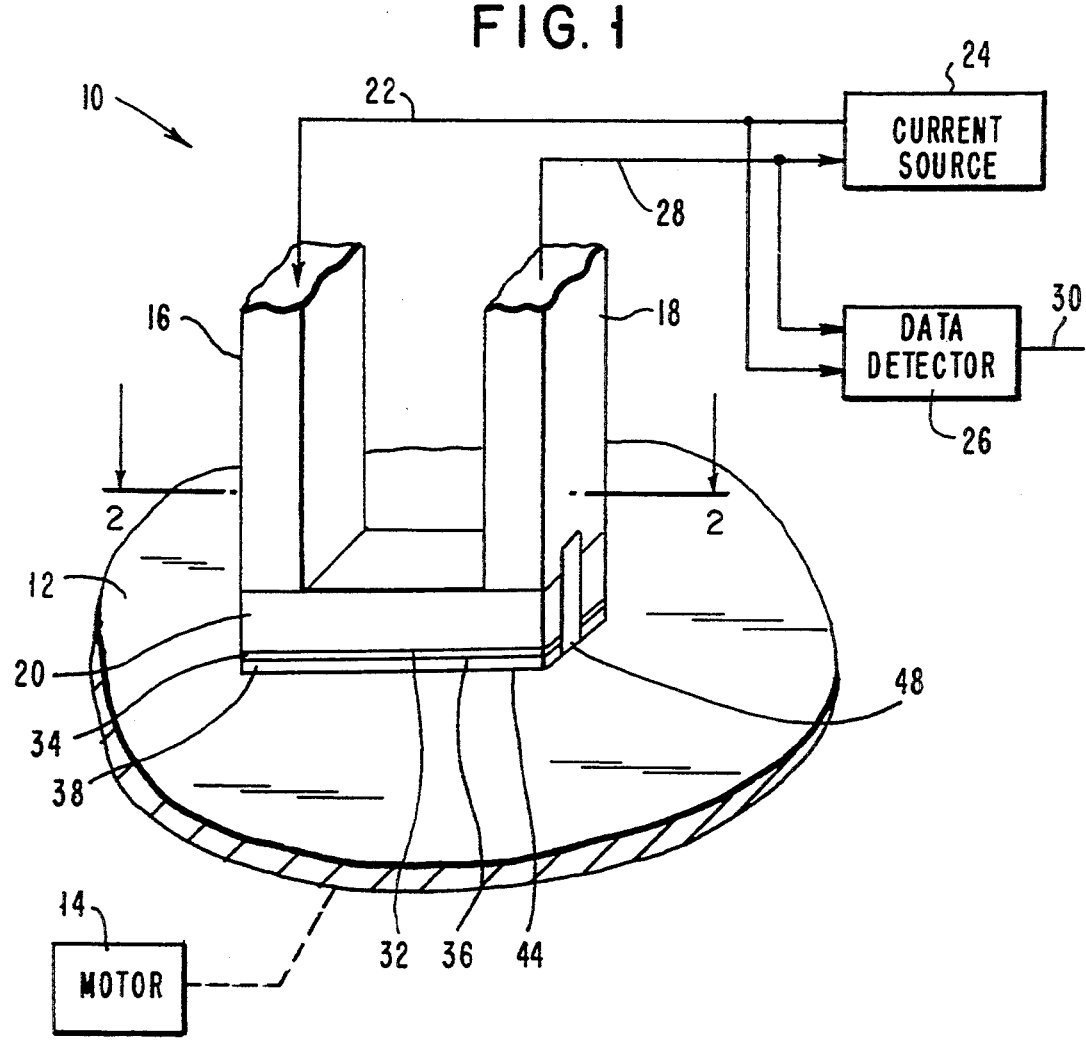
FIG. 1 is a diagram of one embodiment of the invention.

Referring now to the drawing, FIG. 1 shows a giant magnetoresistance sensor 10. Giant magnetoresistance sensor 10 may be positioned over magnetic medium 12 which may be moving with respect to giant magnetoresistance sensor 10 by means of a motor 14 mechanically linked to magnetic medium 12 such as by for example a spindle. Giant magnetoresistance sensor 10 comprises arms 16 and 18 which are mechanically attached to substrate 20 to provide a rigid structure. Am 16 may be electrically conductive and coupled over lead 22 to one side of current source 24 and a first input of data detector 26. Arm 18 is electrically conductive and is coupled over lead 28 to a second terminal of current source 24 and to a second input of data detector 26. Data detector 26 functions to provide an output signal over lead 30 indicative of the data stored in magnetic medium 12 and sensed by giant magnetoresistance sensor 10.

Figure 2:
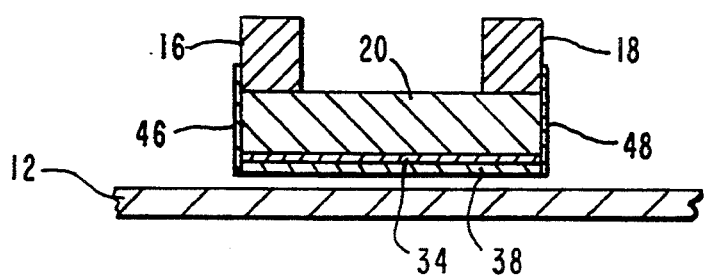
FIG. 2 is a cross section view along the line 2—2 of FIG. 1.

FIG. 2 shows a cross section view along the line 2—2 of FIG. 1. Substrate 20 may have a lower surface 32. Substrate 20 may be electrically nonconducting for example, glass, ceramic etc. material or substrate 20 may be conducting such as single crystalline silicon or single crystalline silicon germanium alloy or single crystalline germanium which would include means for insulating substrate 20 from arms 16 and 18. On lower surface 32, may be formed a layer 34. Layer 34 may be a dilute Cu—Co alloy having Co in the range from 0.5 to 10 atomic percent to provide a (100) texture on its lower surface 36. If substrate 20 is single crystalline silicon having a lower surface in the (100) plane, then layer 34 may be epitaxially formed on lower surface 32 to provide a corresponding lower surface 36 in the (100) crystalline plane. If substrate 20 is single crystalline substrate material having a lower surface 32 and is generally nonconducting, then layer 34 may not be necessary. Layer 34 may be comprised of various insulating materials if the insulating materials may be formed epitaxially on lower surface 32 of single crystalline substrate 20 having a lower surface 36 in the (100) plane. Examples of epitaxial material suitable for layer 34 may be selected from the group consisting of BaO, SrO, CuO, $Y_2O_3$, $CaF_2$, $BaF_2$ and alloys thereof. Alternatively, layer 34 may be conducting if it is thin so as not to shunt too much current from the magnetoresistance layer, then layer 34 may be a metal silicide such as cobalt silicide, nickel silicide and alloys thereof. If substrate 20 is single crystalline silicon having a lower surface 32 in the (100) plane then layer 34 may be copper formed by evaporating or electroplating Cu with a (100) orientation on its lower surface 36 which corresponds to a copper layer having a cube texture.

A layer 38 of Cu—Ni—Co alloy with a (100) texture is grown by evaporating or electroplating Cu—Ni—Co on lower surface 36 of layer 34 and if layer 34 is not present, then on lower surface 32. Layer 38 is grown having a (100) texture so that the magnetic easy axes of magnetic particles 40 precipitating within layer 38 have a magnetic easy axes in the plane of layer 38. If the magnetic easy axes is in a plane of a film or layer 38, then for optimum detection, the magnetic field to be sensed should also be in the same plane.

Layer 38 may also be selected from silver (Ag), gold (Au) and alloys thereof. Both are highly conductive, nonmagnetic metals with a cubic crystal structure. Ag and Au have larger lattice constants than Cu and may be epitaxially deposited on a substrate having lattice matching such as GaAs for (100) epitaxial growth. Ni—Co alloys are the only known, low anisotropy, low magnetostriction magnetic material that can be precipitated out of a copper matrix. Ni—Fe alloys such as Permalloy are soluable in copper.

However, Ni—Fe alloys, such as Permalloy, can be precipitated out of (100) Ag, Au or alloys thereof to provide the oriented crystalline or magnetic particles 40. The Ni—Fe alloys, such as Permally, have low anisotropy and low magneto-striction suitable for magnetic particles 40.

Figure 3:
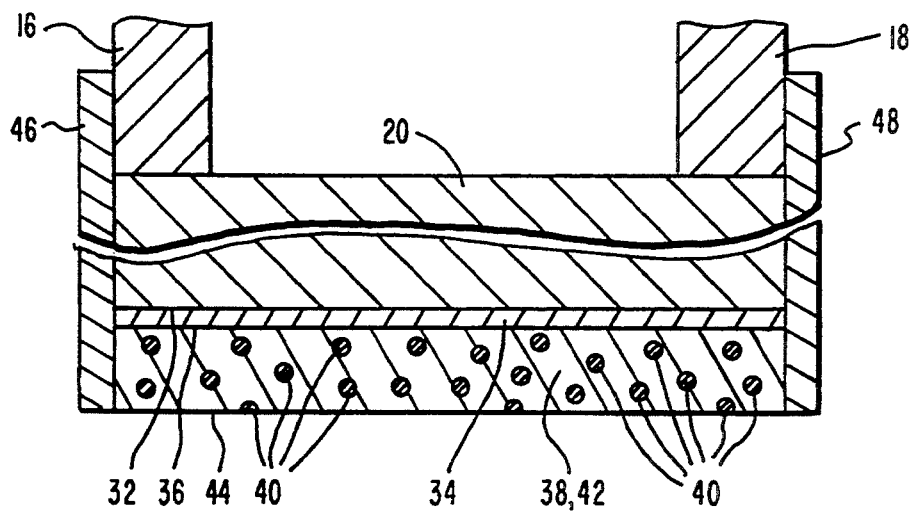
FIG. 3 is an enlarged view of a portion of FIG. 2.

FIG. 3 is an enlarged view of a portion of FIG. 2. Layer 38 after being formed and heat treated, forms magnetic particles or precipitates of a single domain size which are preferable in the range from 40 to 400 angstroms across at its widest dimension such as its diameter or length.

Layer 38 of Cu—Ni—Co alloy should be formed or deposited epitaxially at as low a temperature as possible, for example on an unheated layer 34 or substrate 20. After layer 38 is deposited, layer 38 is heated in the range from 200° to 500° C. in vacuum for 30 minutes and then cooled back down to 23° C. If the alloy comprises Ag or Au, Ni and Fe, then the annealing temperature may be in the range from 100° to 500° C. The size of magnetic particles 40 is controlled by the annealing temperature of layer 38 which at 450C gives a widest dimension or diameter of 100° A. In the as deposited layer 38 at 23° C., there is some precipitation of 50° A. diameter particles.

Magnetic particles 40 may comprise a nickel cobalt alloy. Magnetic particles 40 may have cobalt in the range from 4 to 20 atomic percent and are a single domain size. A single domain size means that the magnetic particle is not physically large enough to support a domain wall. Multi-domain particles are particles physically large enough to support one or more domain walls. Magnetic particles 40 when they precipitate out of the Cu—Ni—Co alloy form a copper matrix 42 within which magnetic particles 40 are dispersed. Magnetic particles 40 should not be touching in copper matrix 42 but should be spaced apart.

The volume fraction of magnetic particles 40 may be in the range from 5 to 25 volume percent without touching adjacent particles in copper matrix 42 and preferably about 20 volume percent.

Nickel-cobalt alloys with cobalt in the range from 4 to 20 atomic percent may have a magnetocrystalline anisotropy constant ($K_1$) between 0 and $3 \times 10^4$ ergs/cm$^3$ which is relatively small and positive. By having magnetic particles 40 with a magnetocrystalline anisotropy constant $K_1$ equal to a positive value, the easy magnetic axes of the magnetic particle 40 is along the (100), (010) and (001) directions. Nickel-cobalt alloys are preferred at the higher cobalt compositions in the range from 13 to 20 atomic percent. Magnetic particles 40 with a nickel cobalt alloy having high cobalt compositions near 18 percent have a low magnetostriction constant, $\lambda$, less than 30 ppm. It is noted that the magnetostriction constant $\lambda$ is equal to or about 0 for a nickel cobalt alloy having 20 atomic percent cobalt. When the magnetic particles 40 precipitate from a Cu—Ni—Co Alloy to form copper matrix 42, the nickel-cobalt alloy of magnetic particles 40 will contain a few percent (5) of copper also. The atomic percent of copper in magnetic particles 40 is dependent upon the solubility of copper into the Ni—Co alloy. Higher concentrations of nickel in the alloy will result in a higher solubility of copper. Copper is dissolved in the alloy at the anneal temperature. The copper in magnetic particles 40 will also help to lower the magnetostriction constant $\lambda$.

The lower surface 44 of layer 38 is positioned near magnetic medium 12 so that the magnetic field to be sensed is in the plane of layer 38.

Referring to FIG. 1, the ends of layer 38 are coupled to arms 16 and 18, respectively, by way of contacts or electrodes 46 and 48. Contacts 46 and 48 may also inadvertently be coupled to the ends of layer 34. It would be an advantage if conductive layer 34 was avoided (not needed) because conductive layer 34 provides a parallel shunt path with respect to the path through layer 38 which reduces the magnitude of ΔR/R of layer 38. Layer 38 may be formed on an insulating layer 34 or on a semiconductor substrate having a surface in the (100) plane.

In operation of giant magnetoresistance sensor 10, current source 24 shown in FIG. 1, provides a current over lead 22 through arm 16, contact or electrode 46, layer 38, contact or electrode 48, arm 18 and back through lead 28. Motor 14 functions to move magnetic media 12 having data written therein corresponding to magnetic fields which exist above magnetic media 12 in various directions which layer 38 passes through. If the magnetic field in layer 38 aligns the magnetic direction of the magnetic particles 40 in a common direction, the resistance to electrons traveling through layer 38 will be low such as 50 percent lower than when the easy axes of the magnetic particles are oriented in multiple directions. Electrons traveling through layer 38 are apparently scattered by their own electron spin at each interface when passing through copper matrix 42 to magnetic particles 40 having their easy axes in various directions.

By using the known properties of Ni—Co alloys as precipitates in forming magnetic particles 40, it is estimated that the anisotropy field of a nickel-cobalt alloy having 18 atomic percent cobalt would be 10 to 20 Oe. If the precipitated particles 40 have oblate spheroidal shape as cobalt particles typically have in copper, the shape anisotropy of particles 40 would be less than $10^4$ ergs/cm$^3$.

A number of samples of layer 34 of Cu—Co having 0.5 percent to 10 percent Co with pronounced (100) texture have been prepared by annealing at 450 Celsius.

Figure 4:
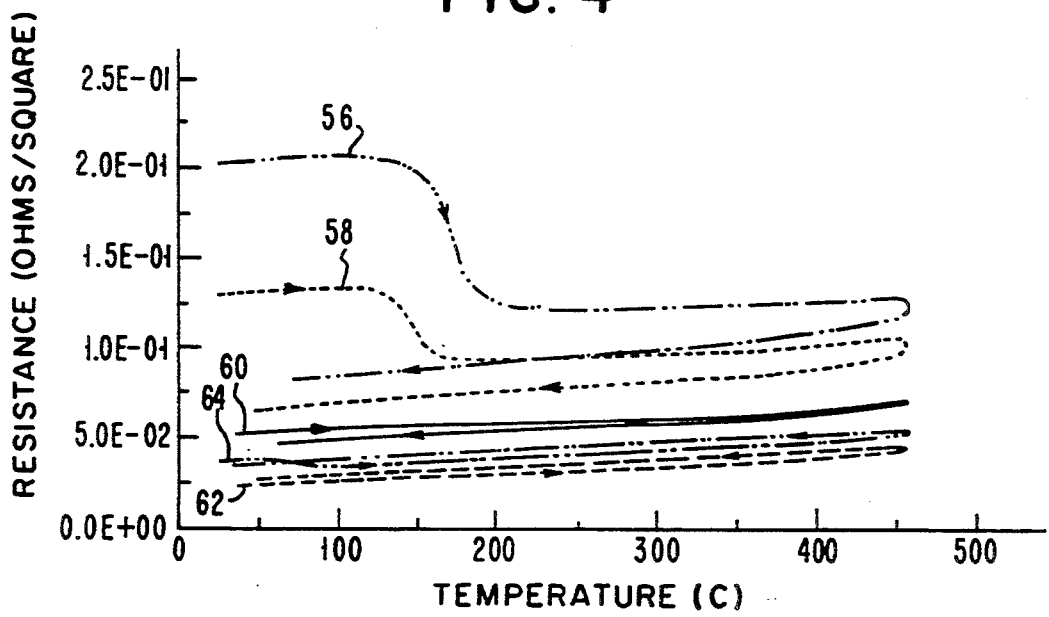
FIG. 4 is a graph of the sheet resistance versus temperature of Cu—Co films with various percentages of Co.

FIG. 4 is a graph of the sheet resistance of layer 34 versus temperature of Cu—Co films with various percentages of Co. In FIG. 4 the ordinate represents sheet resistance in ohms/square and the abscissa represents temperature in degrees Celsius. The Cu—Co films of various cobalt concentrations was formed by co-evaporating copper and cobalt. In FIG. 4, curve 56 corresponds to a film having 8.3 atomic percent cobalt. Curve 58 corresponds to a film having 5.4 atomic percent cobalt. Curve 60 corresponds to a copper-cobalt film having 1.4 atomic percent cobalt. Curve 62 corresponds to a copper cobalt film having 1.1 atomic percent cobalt. Curve 64 corresponds to a copper cobalt film having 0.6 atomic percent cobalt. In FIG. 4, the copper cobalt films were formed and then annealed by raising the temperature from 23 up to 450 degrees Celsius and then cooling them back to room temperature. As shown in FIG. 4, especially with curves 56 and 58, annealing or raising the temperature of the films in the range from 200 to 450 degrees Celsius resulted in (110) oriented grains up to 30 μm in diameter. The grain growth seems to be associated with the precipitation of the cobalt from the copper cobalt alloy which also causes an abrupt irreversible decrease in resistance as shown by curves 56 and 58 in FIG. 4.

Figure 5:
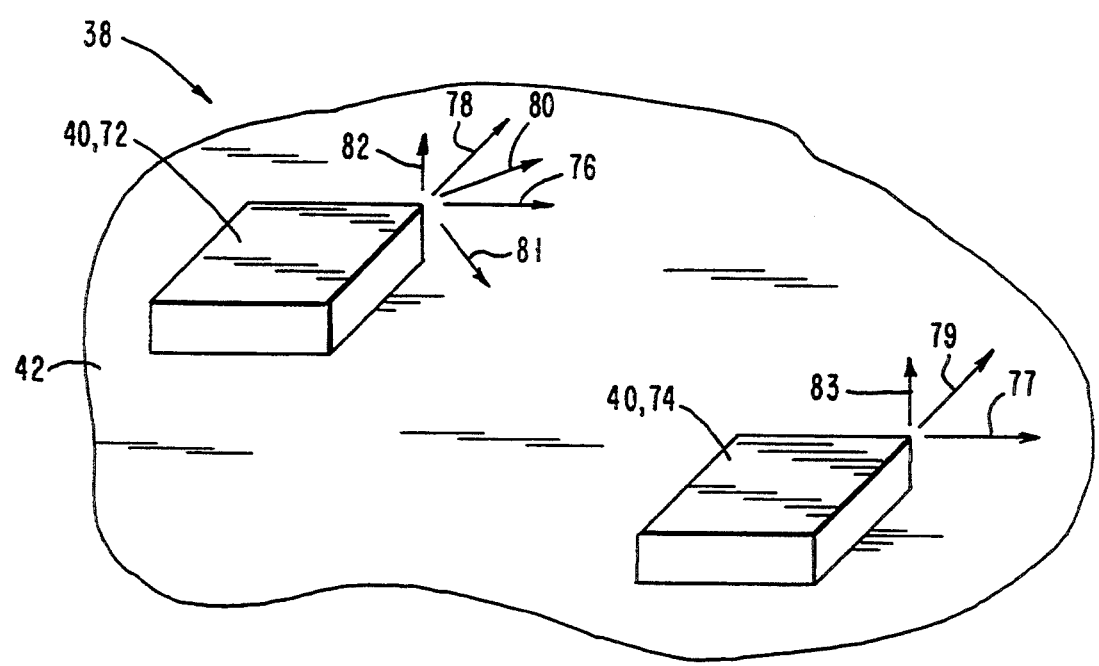
FIG. 5 is a diagram of spaced apart magnetic particles in a metal matrix crystallographically oriented and showing their magnetic axes.

Referring to FIG. 5, a diagram of a small portion of layer 38 is shown. Magnetic particles 40 are dispersed in copper matrix 42. The copper in layer 38 has a (100) texture and a crystallographic unit cell that is cubic. Magnetic particles 72 and 74 of Ni—Co or Ni—Co—Cu are also cubic in their crystallographic arrangement with the unit cell of magnetic particles 72 and 74 cubic, the easy axes is in the (001) direction as shown by arrows 76 and 77, respectively. The easy axes is also in the (100) direction as shown by arrows 78 and 79, respectively, for magnetic particles 72 and 74. Axes (001) of magnetic particles 72 and 74 are parallel to one another and in the plane of layer 38 and axes (100) are parallel to one another and in the plane of layer 38. The axes are parallel to one another due to the fact that these particles are precipitated from or within a (100) texture layer. The diagonal direction between the corners of the unit cell in the plane of layer 38 is in the hard axis direction. The hard axis direction is shown by arrows 80 and 81 and are at an angle of 45° to the easy axis directions shown by arrows 76–79. The easy axis corresponds to the side edges of the cubic unit cell. Even though particles 72 and 74 in FIG. 5 are shown as cubes, in actuality the physical shape of particles 72 and 74 are close to or substantially oblate spheroids. The easy axes in the (010) direction is orthogonal to layer 38 as shown by arrows 82 and 83 respectively, for magnetic particles 72 and 74. The oblate spheroid shape anisotropy reduces the easy axis magnetic component in the (010) direction so that its value is much less than the in-plane easy axis magnetic components While there has been described and illustrated a giant magnetoresistance sensor having an oriented granular layer containing magnetic particles of a nickel cobalt alloy, it will be apparent to those skilled in the art that modifications and variations are possible without deviating from the broad scope of the invention which shall be limited by the scope of the claims appended hereto.

Having thus described our invention, what we claim as new and desire to secure by Letters Patents is:

1. A magnetoresistance sensor comprising:
  an electrically conductive matrix in which magnetic particles are dispersed, said magnetic particles are of a single domain size having a diameter or length in the range from 40 to 400 angstroms, said magnetic particles having a respective magnetocrystalline anisotropy constant $K_1$, in the range from 0 to $3 \times 10^4$ ergs/cm$^3$ and a magnetostriction constant $\lambda$ less than 30 ppm, and wherein said magnetic particles are crystallographically oriented so that, respective easy magnetic axes of said magnetic particles are substantially parallel to one another.

2. A magnetoresistance sensor comprising:
  an electrically conductive matrix in which magnetic particles are dispersed, said magnetic particles are of a single domain size having a diameter or length in the range from 40 to 400 angstroms, said magnetic particles having a respective magnetocrystalline anisotropy constant $K_1$, in the range from 0 to $3 \times 10^4$ ergs/cm$^3$ and a magnetostriction constant $\lambda$ less than 30 ppm and wherein the volume fraction of said magnetic particles in said conductive matrix is in the range from 5 to 25 volume percent.

3. A magnetoresistance sensor comprising:
  an electrically conductive matrix in which magnetic particles are dispersed, said magnetic particles are of a single domain size having a diameter or length in the range from 40 to 400 angstroms, said magnetic particles having a respective magnetocrystalline anisotropy constant $K_1$, in the range from 0 to $3 \times 10^4$ ergs/cm$^3$ and a magnetostriction constant $\lambda$ less than 30 ppm and wherein said conductive matrix is selected from the group consisting of Ag, Au, Ni, Fe and alloys thereof.

4. A magnetoresistance sensor comprising:
  an electrically conductive matrix in which magnetic particles are dispersed, said magnetic particles are of a single domain size having a diameter or length in the range from 40 to 400 angstroms, said magnetic particles having a respective magnetocrystalline anisotropy constant $K_1$, in the range from 0 to $3 \times 10^4$ ergs/cm$^3$ and a magnetostriction constant $\lambda$ less than 30 ppm and wherein said magnetic particles comprise a Ni—Fe alloy.

5. A magnetoresistance sensor comprising:

an electrically conductive matrix in which magnetic particles are dispersed, said magnetic particles are of a single domain size having a diameter or length in the range from 40 to 400 angstroms, said magnetic particles having a respective magnetocrystalline anisotropy constant $K_1$, in the range from 0 to $3 \times 10^4$ ergs/cm$^3$ and a magnetostriction constant $\lambda$ less than 30 ppm and wherein said conductive matrix is selected from the group consisting of Cu, Ni, Co and alloys thereof.

6. A magnetoresistance sensor comprising:

an electrically conductive matrix in which magnetic particles are dispersed, said magnetic particles are of a single domain size having a diameter or length in the range from 40 to 400 angstroms, said magnetic particles having a respective magnetocrystalline anisotropy constant $K_1$, in the range from 0 to $3 \times 10^4$ ergs/cm$^3$ and a magnetostriction constant $\lambda$ less than 30 ppm and wherein said magnetic particles comprise a Ni—Co alloy.

7. A giant magnetoresistance sensor for sensing magnetic fields comprising:

a substrate, a first layer formed on said substrate, said first layer including particles of a single crystalline domain in a copper matrix, said particles including an alloy of Ni and Co where the amount of Co is in the range from 4 to 20 percent, and first and second contacts spaced apart and in ohmic contact with said first layer.

8. The giant magnetoresistance sensor of claim 7 further including a current source coupled to said contacts for passing electrical current through said first layer.

9. The giant magnetoresistance sensor of claim 7 wherein the respective magnetic easy axes of said particles is in the plane of said first layer.

10. The giant magnetoresistance sensor of claim 7 wherein said alloy includes Cu.

11. The giant magnetoresistance sensor of claim 7 wherein said matrix and particles are formed from a layer grown with a (100) texture and by the precipitation of said particles.

12. The giant magnetoresistance sensor of claim 7 further including a second layer of a dilute Cu—Co alloy having in the range from 0.5 to 10 atomic percent Co having a substantial (100) texture positioned below and adjacent said first layer.

13. The giant magnetoresistance sensor of claim 7 wherein said substrate is a single crystal Si having a (100) oriented upper surface.

14. The giant magnetoresistance sensor of claim 13 further including a layer of Cu formed on said upper surface having a (100) oriented upper surface.

15. The giant magnetoresistance sensor of claim 7 wherein said particles have a maximum dimension in the range from 40 to 400 angstroms.

16. The giant magnetoresistance sensor of claim 7 wherein the volume fraction of said magnetic particles in said copper matrix is in the range from 5 to 25 volume percent.

17. The magnetoresistance sensor of claim 7 wherein said particles have a magnetocrystalline anisotropy constant $K_1$ in the range from 0 to $3 \times 10^4$ ergs/cm$^3$ and a magnetostriction constant $\lambda$ less than 30 ppm.

18. A giant magnetoresistance sensor for sensing magnetic fields comprising:

a substrate, a first layer formed on said substrate, said first layer including particles of a single crystalline domain in a matrix selected from the group consisting of Ag, Au and alloys thereof, said first layer having a substantial (100) texture, said particles including an alloy of Ni and Fe where the amount of Fe is in the range from 4 to 20 percent, and first and second contacts spaced apart and in ohmic contact with said first layer.

19. The giant magnetoresistance sensor of claim 18 further including a current source coupled to said contacts for passing electrical current through said first layer.

20. The giant magnetoresistance sensor of claim 18 wherein the respective magnetic easy axes of said particles is in the plane of said first layer.

21. The giant magnetoresistance sensor of claim 18 wherein said alloy includes atoms dissolved from said matrix.

22. The giant magnetoresistance sensor of claim 18 wherein said matrix and particles are formed from a layer grown with a (100) texture and by the precipitation of said particles.

23. The giant magnetoresistance sensor of claim 18 further including a second layer having a substantial (100) texture positioned below and adjacent said first layer.

24. The giant magnetoresistance sensor of claim 18 wherein said substrate is a single crystal semiconductor having a (100) oriented upper surface.

25. The giant magnetoresistance sensor of claim 24 further including a layer selected from the group consisting of Ag, Au, SiGe and alloys thereof formed on said upper surface having a (100) oriented upper surface.

26. The giant magnetoresistance sensor of claim 18 wherein said particles have a maximum dimension in the range from 40 to 400 angstroms.

27. The giant magnetoresistance sensor of claim 18 wherein the volume fraction of said magnetic particles in said matrix is in the range from 5 to 25 volume percent.

28. The giant magnetoresistance sensor of claim 18 wherein said particles have a magnetocrystalline anisotropy constant $K_1$ in the range from 0 to $3 \times 10^4$ ergs/cm$^3$ and a magnetostriction constant $\lambda$ less than 30 ppm.

* * * * *